United States Patent [19]
Weaver et al.

[11] Patent Number: 5,627,492
[45] Date of Patent: May 6, 1997

[54] CIRCUIT AND METHOD FOR ISOLATING CIRCUIT BLOCKS FOR REDUCING POWER DISSIPATION

[75] Inventors: Mark Weaver, Phoenix; Robert D. Berger, Chandler; Dwight D. Esgar, Queen Creek, all of Ariz.

[73] Assignee: Motorola, Inc., Schaumburg, Ill.

[21] Appl. No.: 552,709

[22] Filed: Nov. 3, 1995

[51] Int. Cl.$^6$ ................................. G05F 1/10
[52] U.S. Cl. ............................. 327/544; 327/564
[58] Field of Search .................... 327/333, 544, 327/202, 203, 94, 564, 565; 326/126

[56] References Cited

U.S. PATENT DOCUMENTS

| | | | |
|---|---|---|---|
| 4,484,087 | 11/1984 | Mazin et al. | 327/203 |
| 4,495,628 | 1/1985 | Zasio | 327/202 |
| 4,554,467 | 11/1985 | Vaughn | 327/203 |
| 5,250,852 | 10/1993 | Ovens et al. | 327/202 |
| 5,294,928 | 3/1994 | Cooper et al. | 327/544 |
| 5,459,421 | 10/1995 | Shaw | 327/203 |
| 5,488,320 | 1/1996 | Carvella et al. | 327/203 |

Primary Examiner—Toan Tran
Attorney, Agent, or Firm—Gary W. Hoshizaki

[57] ABSTRACT

An integrated circuit is divided into functional blocks. The integrated circuit includes current source based circuitry such as Emitter Coupled Logic (ECL), Current Mode Logic (CML), or Source Coupled Logic (SCL) Isolation blocks (14-20) are placed in signal paths to and from each functional block. A multiple output bias driver circuit (13) couples to each functional block. The multiple output bias driver circuit (13) provides a signal for enabling and disabling current sources of a functional block. A bias control logic circuit (12) controls the isolation blocks (14-20) and the multiple output bias driver (13). A functional block that is idle in the operation of the integrated circuit is shut down by the bias control logic circuit (12) to conserve power. The multiple output bias driver circuit (13) receives control signals from the bias control logic circuit (12) to turn off current sources in the idle functional block. Isolation blocks (14-20) receive control signals from the bias control logic circuit (12) to isolate the idle functional block and to provide a predetermined logic level in the signal paths from the idle functional to prevent propagation of an erroneous signal.

13 Claims, 3 Drawing Sheets

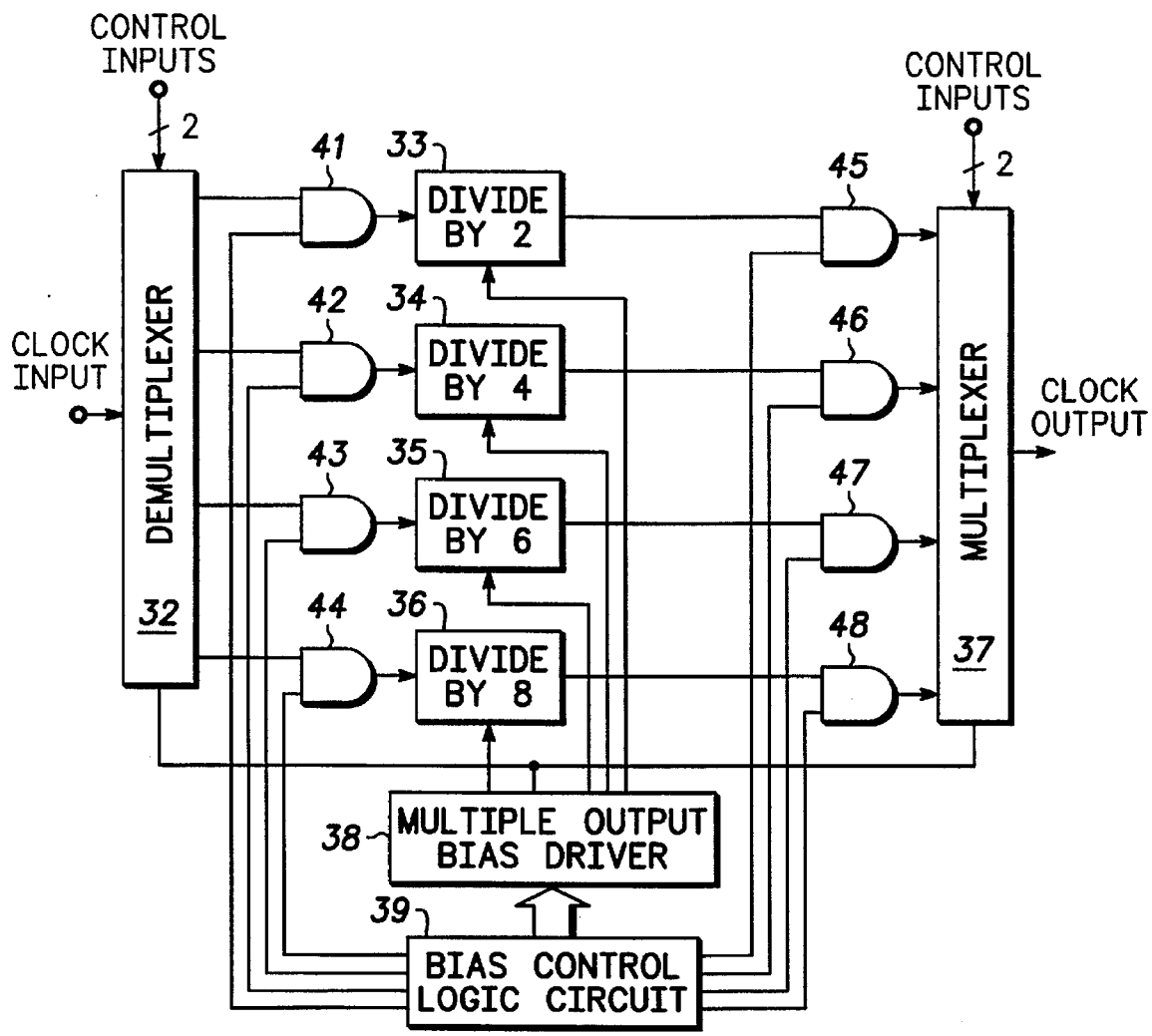
FIG. 3 _31_

CIRCUIT AND METHOD FOR ISOLATING CIRCUIT BLOCKS FOR REDUCING POWER DISSIPATION

BACKGROUND OF THE INVENTION

This invention relates, in general, to low power integrated circuit designs, and more particularly, to reducing power consumption of an integrated circuit.

The power consumption of an integrated circuit is always a critical performance parameter. The increase in circuit density due to smaller device geometries and the prevalent use of battery power has raised the importance of reducing power consumption to a high level. Complementary Metal Oxide Semiconductors (CMOS) has been a popular technology for low power circuits. CMOS is considered a low power integrated circuit process due to the low power dissipated under static conditions. A CMOS gate in a static condition does not have a DC bias current to dissipate power. Power dissipation from a CMOS circuit is due to reverse biased junction leakage currents which are normally extremely small in magnitude.

Other technologies such as Emitter Coupled Logic (ECL) or Current Mode Logic (CML) dissipate power under static conditions. The technologies that dissipate power under static conditions typically use current sources to bias circuitry. Although static power is dissipated in circuitry using current sources they are well known for providing high performance. The static power dissipation of these types of circuits prevent there use in many low power applications.

It would be of great benefit if a circuit and method could be developed that reduces power dissipation in circuits having current sources thereby allowing their incorporation in low power circuits to enhance performance.

BRIEF DESCRIPTION OF THE DRAWINGS

FIG. 3 is an illustration of a clock divider circuit having block isolation circuitry for reducing power consumption in accordance with the present invention.

DETAILED DESCRIPTION OF THE DRAWINGS

Figure 1:
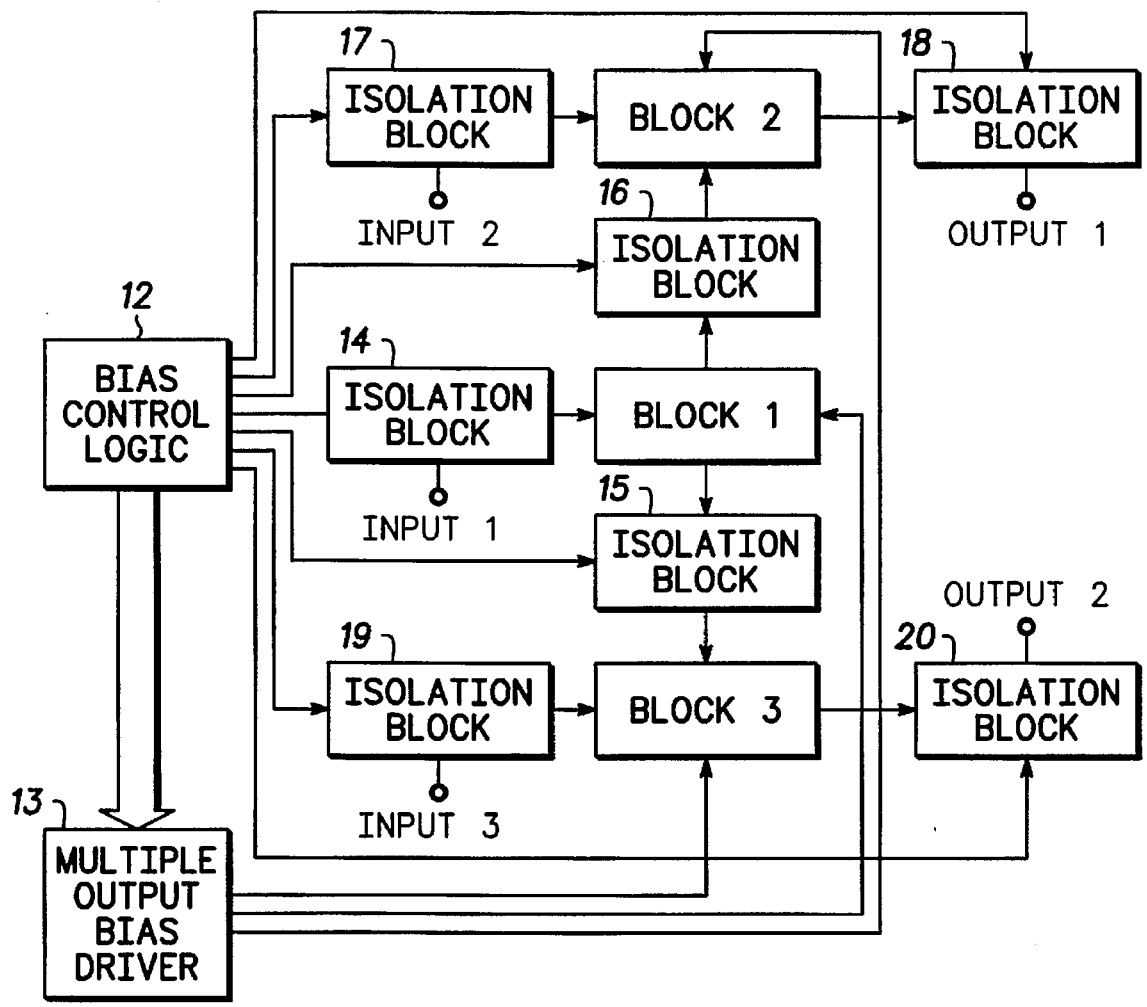
FIG. 1 is an illustration of a current source based circuit partitioned into blocks to reduce power consumption in accordance with the present invention.

The density and speed of an integrated circuit increases as semiconductor wafer processes produce smaller devices with more layers of device interconnect. Both circuit density and the speed of operation affect power dissipation of an integrated circuit. Static and dynamic power dissipation are characterized to determine the total power consumption of an integrated circuit. Static power dissipation is the power consumed by an integrated circuit under quiescent or idle conditions, for example, an idle condition exists when the logic levels within a circuit do not change. Dynamic power dissipation is the power consumed by an integrated circuit when the circuit is being used, for example, the logic levels within the circuit are changing. The type of semiconductor technology used (Metal Oxide Semiconductor Field Effect Transistors (MOSFETs), Bipolar, Gallium Arsenide, etc.) and the circuit type (Complementary Metal Oxide Semiconductors (CMOS), Emitter Coupled Logic, etc.) plays a critical role in the power dissipated by a circuit. In general, the use of battery power for powering integrated circuits has made power consumption a critical parameter in determining the semiconductor technology for a circuit design.

Previously, when circuits operated at much lower speeds, the dominant factor in selecting a low power semiconductor process was static power dissipation. Typically, the circuitry did not operate at high speeds or have the circuit density that produced high dynamic power dissipation. Another factor that reduces dynamic power dissipation occurs when a circuit has long idle periods between operation. The instantaneous dynamic power dissipation may be high when the circuit is operating but the average dynamic power dissipation is low. One semiconductor technology that the industry embraced due to it's low static power dissipation is a Metal Oxide Semiconductor Field Effect Transistor (MOSFET) process having Complementary Metal Oxide Semiconductor (CMOS) digital circuitry.

The dynamic power dissipation of an integrated circuit typically increases as wafer processes produce smaller geometry devices whereby circuit density and circuit speeds are improved. The increase in power dissipation is significant enough that design methodologies are being employed to reduce the switching of CMOS digital circuitry. In fact, the increase in dynamic power dissipation due to high operating speeds of CMOS digital circuitry has made other technologies that were once not viable due to their static power dissipation more appealing.

A group of circuits that are traditionally used for high speed applications where power dissipation is not an issue can be classified by their use of current sources for providing a DC bias current. Emitter Coupled Logic (ECL), Current Mode Logic (CML), and Source Coupled Logic (SCL) are an example of circuits that utilize current sources in their design. This type of circuitry is referred to as current source based circuitry hereinafter. Static power dissipation is high on current source based circuitry because the current sources are enabled under static conditions causing a constant power drain. It should be noted that the current source based circuitry is well known for their exceptional high speed performance when compared against CMOS digital circuitry. The viability of the current source based circuitry could be greatly enhanced if the combined static and dynamic power dissipation could be reduced to a level approaching CMOS digital circuitry operating at high speeds. In fact, the current source based circuitry could become the design choice for a broad spectrum of circuit designs due to the performance benefits of this type of circuitry.

In general, integrated circuit designs are architected into blocks. The block subdivision within a circuit design is a logical process. The blocks typically perform an individual task or operation in the circuit. For example, a multiplier, an adder, and a memory would be considered blocks of a micro-controller circuit. Power is reduced in current source based circuitry by isolating blocks of a circuit design such that the current sources of a block are turned off when the block is not in use. The total power dissipated by the circuit design is substantially reduced using this technique.

The blocks of a current source based circuit are partitioned in a manner that each can be turned off (to reduce power consumption) without affecting the remaining blocks that are not turned off. The inputs and outputs of current source based circuits "float" when the current sources are turned off. In other words, the signals at the inputs and outputs are not stable or at a fixed logic level. Isolation blocks are inserted at the boundaries of blocks to prevent an invalid logic state from cascading through other blocks. Isolation blocks may not be required at the inputs of some blocks if input signals are not affected by turning off current sources of the block. The isolation blocks perform two functions. First, the isolation blocks isolate one block from another to prevent a floating signal from propagating to an active block. Second, the isolation block provides a predetermined logic level to an active block that does not affect it's operation. A control logic circuit turns off the current sources of a block when the block is not in use to reduce power dissipation. The control logic circuit also provides a control signal to the isolation blocks to either allow information to be passed between blocks or to isolate blocks from one another.

FIG. 1 is a block diagram illustrating a current source based circuit 11 subdivided into blocks that can be isolated from one another to reduce power consumption. Current source based circuit 11 includes an Input 1, an Input 2, an Input 3, an Output 1, and an Output 2. Current source based circuit 11, for example, could be comprised of Emitter Coupled Logic (ECL) circuits that are partitioned into a Block 1, a Block 2, and a Block 3. Each block, at times, functions independent of some of the other blocks such that the current sources of a non-used block are disabled to save power.

A method of isolating functional blocks of a current source based circuit involves controlling signal paths into and out of each functional block. An idle functional block that is not used is isolated from remaining functional blocks to allow their operation to continue. The idle functional block is isolated by isolation blocks which prevent signals from entering or leaving the idle functional block. The isolation blocks provide a predetermined logic level to the remaining functional blocks still operating to prevent the propagation of erroneous signals. The predetermined logic level does not affect the operation of the remaining functional blocks.

Isolation circuitry of current source based circuit 11 comprises bias control logic circuit 12, multiple output bias driver 13, and isolation blocks 14–20. Bias control logic circuit 12 generates control signals that isolates a block (or blocks) of current source based circuit 11. Multiple output bias driver 13 enables and disables current sources of Blocks 1–3 based on the control signals of Bias control logic circuit 12. Isolation blocks 14–20 in the input and output signal paths from each block. Isolation blocks 14–20 under normal conditions couple one block to another. In an isolation mode isolation blocks 14–20 decouple a block from other blocks and provide a predetermined logic level to blocks still operating.

Isolation block 14 has an input coupled to Input 1, a control input coupled for receiving a control signal from control logic circuit 12, and an output. Block 1 has an input coupled to the output of isolation block 14, a control input coupled for receiving a control signal from multiple output bias driver 13, a first output, and a second output. Isolation block 15 has an input coupled to the first output of Block 1, a control input coupled for receiving a control signal from bias control logic circuit 12, and an output. Isolation block 16 has an input coupled to the second output of Block 1, a control input coupled for receiving a control signal from bias control logic circuit 12, and an output.

Isolation block 17 has an input coupled to Input 2, a control input coupled for receiving a control signal from bias control logic circuit 12, and an output. Block 2 has a first input coupled to the output of isolation block 17, a second input coupled to the output of isolation block 16, a control input coupled for receiving a control signal from multiple output bias driver 13, and an output. Isolation block 18 has an input coupled to the output of Block 2, a control input coupled for receiving a control signal from bias control logic circuit 12, and an output coupled to Output 1.

Isolation block 19 has an input coupled to Input 3, a control input coupled for receiving a control signal from bias control logic circuit 12, and an output. Block 3 has a first input coupled to the output of isolation block 19, a second input coupled to the output of isolation block 15, a control input coupled for receiving a control signal from multiple output bias driver 13, and an output. Isolation block 20 has an input coupled to the output of Block 3, a control input coupled for receiving a control signal from bias control logic circuit 12, and an output coupled to Output 2. Multiple output bias driver 13 is coupled for receiving control signals from bias control logic circuit 12. In one embodiment, multiple output bias driver 13 generates reference voltages (control signals) for biasing current sources of a block for providing the correct current.

Current source based circuit 11 is simplified to illustrate the principals used in reducing power by turning off and isolating unused blocks. One concept is the use of isolation blocks at the inputs and outputs of a block to decouple the block that is shut down from other blocks still enabled. The isolation blocks also provide a predetermine logic level at the outputs of the block being turned off to prevent a wrong logic level from propagating through the enabled blocks.

An example, of block isolation is illustrated by isolating Block 1. Bias control logic circuit 12 provides control signals to isolation blocks 14, 15, and 16 to decouple Block 1 from Input 1 and Blocks 2 and 3. Isolation blocks 15 and 16 provide a predetermined logic level respectively to Blocks 3 and 2. Multiple output bias driver 13 receives control signals from bias control logic circuit 12 to disable the current sources in Block 1. Blocks 2 and 3 are capable of continuing operation while the power that would normally be dissipated by Block 1 under static conditions is saved. Isolating Blocks 2 and 3 is performed in a similar manner.

Block 1 is enabled for operation by reversing the procedure described hereinabove. Bias control logic circuit 12 provides control signals to multiple output bias driver 13 to enable current sources of Block 1. Isolation blocks 14, 15, and 16 are enabled for coupling Input 1 to Block 1 and for providing output signals from Block 1 to Blocks 2 and 3.

In one embodiment, isolation blocks are AND gates or other logical equivalent implementations. The AND gate has a first input, second input, and an output respectively corresponding to the input, control input, and output of an isolation block. Under normal operating conditions control signals having a logic one level are provided by bias control logic circuitry 12 to the second inputs of AND gates forming isolation blocks 14–20. A logic one level applied to the second input of an AND gate allows a signal applied to the first input to be passed to the output of the AND gate. Conversely, a logic zero level provided by bias control logic circuit 12 to the second input of an AND gate disables the AND gate from passing a signal from the first input to the output of the AND gate. The AND gate outputs a logic zero level that corresponds to the predetermined logic level output by an isolation block.

In a second embodiment, control signals from bias control logic circuit 12 to isolation blocks could be eliminated by placing circuitry in a block that detects when the current sources are disabled. As mentioned previously, the outputs "float" when the current sources of a block are disabled. A float condition typically causes an output of a current source based circuit to drift to a voltage higher than normal operating conditions. The float condition is detected which causes isolation blocks to activate thereby isolating the block.

The control signals produced by bias control logic circuit 12 can be generated in many different ways. How and when blocks are turned off to reduce power consumption is a direct function of the type of circuit and how it is operated. In one embodiment, bias control logic circuit 12 is a state machine. A state machine would receive data from a register, for example, a status register that indicates how the circuit is being operated and which blocks are being used. The state machine would generate control signals for isolating a block and for disabling current sources within the block. Another example of a bias control logic circuit 12, is a state machine using an instruction register of a microprocessor to control which blocks are turned off to save power. The instructions inherently define which blocks are being used and which blocks are not being used.

Another approach to bias control logic circuit 12 is to allow external control of block isolation. A single input pin is provided for serially loading an instruction to bias control logic circuit 12. Multiple pins could be added to speed the process of controlling block isolation if required. The instructions provided from an external source determines when blocks are isolated for reducing power dissipation.

Figure 2:
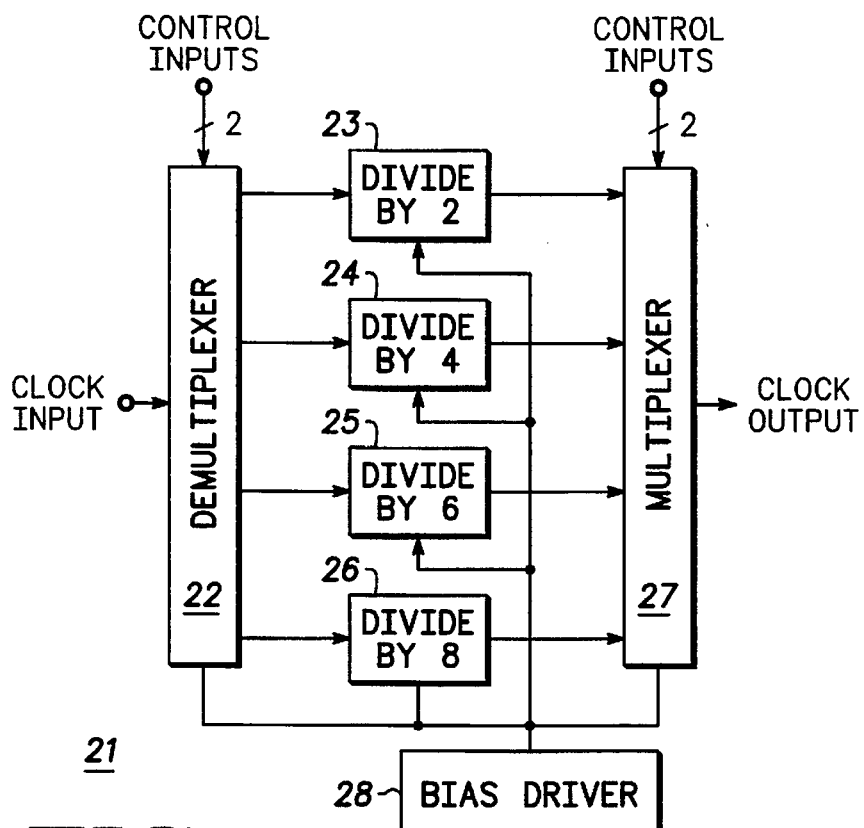
FIG. 2 is an illustration of a clock divider circuit.

FIG. 2 is an illustration of a clock divider circuit 21 for reducing a frequency of a clock signal. Clock divider circuit 21 comprises a demultiplexer 22, a divide by two circuit 23, a divide by four circuit 24, a divide by six circuit 25, a divide by eight circuit 26, a multiplexer 27, and a bias driver circuit 28. Clock divider circuit 21 is made using current source based circuitry, thus power is dissipated under static conditions.

Demultiplexer 22 has a clock input, control inputs, and outputs. A clock signal applied to the clock input is provided to one of the four outputs of demultiplexer 22. The selected output of demultiplexer 22 is determined by the signals applied to the control inputs.

Four divider circuits reduce the frequency of the clock signal. Each divider circuit includes an input coupled to a corresponding output of demultiplexer 22. The divider circuits include divide by two circuit 23, divide by four circuit 24, divide by six circuit 25, and divide by eight circuit 26. Only one of the four divider circuits receives the clock signal at any time.

Multiplexer 27 has four inputs, control inputs and a clock output for providing a clock signal of reduced frequency. Each input of multiplexer 27 couples to a corresponding output of a divider circuit. Control signals applied to the control inputs of multiplexer 22 determine which input is coupled to the clock output.

Bias driver 28 provides a reference voltage for biasing the current sources of demultiplexer 22, divide by two circuit 23, divide by four circuit 24, divide by six circuit 25, divide by eight circuit 26, and multiplexer 27.

A clock signal applied to the clock input of clock divider circuit 21 provides a clock signal reduced by a predetermined ratio at the clock output. The control signals applied to demultiplexer 22 couple the clock signal to one of the four outputs. For example, demultiplexer 22 couples the clock signal to the input of divide by six circuit 25. Divide by six circuit 25 divides the frequency of the clock signal by a factor of six and provides the clock signal of reduced frequency to multiplexer 27. The control inputs of multiplexer 27 select the input coupled to the output of divide by six circuit 25 for coupling the clock signal of reduced frequency to the clock output. Operation of each of the other divider circuits is similar to that described hereinabove. The inefficiency of clock divider circuit 21 is that power is being dissipated by all the divider circuits even though divide by six circuit 25 is the only divider circuit being used.

FIG. 3 is a clock divider circuit 31 corresponding to clock divider circuit 21 of FIG. 2 further including block isolation circuitry for reducing power consumption. Clock divider circuit comprises a demultiplexer 32, a divide by two circuit 33, a divide by four circuit 34, a divide by six circuit 35, a divide by eight circuit 36, a multiplexer 37, a multiple output bias driver 38, a bias control logic circuit 39, and AND gates 41–48. The basic operation of clock divider circuit 31 is identical to the clock divider circuit 21 of FIG. 2 thereby requiring only the differences to be described.

AND gates 41–48 are isolation blocks placed on an input and output of a divider circuit to allow isolation of the divider circuit when not in use. AND gates 41–48 are two input AND gates. AND gates 41–44 isolate the outputs of demultiplexer 32 from the inputs of the divider circuits. AND gate 41 is coupled between a first output of demultiplexer 32 and divide by two circuit 33. AND gate 42 is coupled between a second output of demultiplexer 32 and divide by four circuit 33. AND gate 43 is coupled between a third output of demultiplexer 32 and divide by six circuit 35. AND gate 44 is coupled between a fourth output of demultiplexer 32 and divide by eight circuit 36. Bias control logic circuit 39 provides a control signal to AND gates 41–44.

AND gates 45–48 isolate the outputs of the divider circuits from the inputs of multiplexer 37. AND gate 45 is coupled between divide by two circuit 33 and a first input of multiplexer 37. AND gate 46 is coupled between divide by four circuit 34 and a second input of multiplexer 37. AND gate 47 is coupled between divide by six circuit 35 and a third input of multiplexer 37. AND gate 48 is coupled between divide by eight circuit 36 and a fourth input of multiplexer 37. Multiplexer 37 provides a clock signal reduced in frequency from one of the divider circuits at a clock output.

Multiple output bias driver 38 provides a reference voltage to current sources of the circuitry of clock divider circuit 31. Multiple output bias driver 38 has a first output coupled to demultiplexer 32 and multiplexer 37, a second output coupled to divide by two circuit 33, a third output coupled to divide by four circuit 34, a fourth output coupled to divide by six circuit 35, and a fifth output coupled to divide by eight circuit 36. Having more than one output on multiple output bias driver 38 allows selection on which are activated for use in clock divider circuit 31.

Bias control logic circuit 39 provides control signals for isolating divider circuits and activating and deactivating circuits of clock divider circuit 31. Bias control logic circuit couples to a second input of AND gates 41–48. Bias control logic circuit 39 also couples to multiple output bias driver 38.

In a first case, clock divider circuit 31 could be one block of many (not shown). If clock divider circuit 31 is not required to provide a clock signal of reduced frequency it can be shut down until needed. Bias control logic circuit 39 provides control signals to multiple output bias driver 38 to deactivate or turn off current sources in all circuits of clock divider circuit 31. Isolation blocks should be placed at the clock input (not shown) and the clock output (not shown) to isolate clock divider circuit 31 from any other blocks to prevent a floating signal from propagating false information.

In a second case, the power dissipation of clock divider circuit 31 is minimized when a clock signal of reduced frequency is provided. For example, the clock signal is divided in frequency by a factor of eight. Control signals applied to demultiplexer 32 couple the clock input to AND gate 44. Bias control logic circuit 39 provides a logic one level signal to AND gate 44 and AND gate 48. AND gate 44 passes the clock signal to divide by eight circuit 36. Divide by eight circuit 36 divides reduces the frequency of the clock signal by a factor of eight. AND gate 48 passes the clock signal of reduced frequency to multiplexer 37. Control signals applied to the control inputs of multiplexer 37 select the fourth input coupling the clock signal divided by a factor of eight to the clock output.

Power consumption is reduced by turning off the current sources of divide by two circuit 33, divide by four circuit 34, and divide by six circuit 35 which are not being used. AND gates 41, 42, 43, 45, 46, and 47 receive a logic zero level control signal from bias control logic circuit 39 for providing a predetermined logic level (logic zero level) when a block is isolated. Bias control logic circuit 39 provides control signals to multiple output bias driver 38 for turning off the current sources of divide by two circuit 33, divide by four circuit 34, and divide by six circuit 35 which are isolated by AND gates. Operation using other divider circuits would be similarly performed by turning off the unused divider circuits as described hereinabove.

Figure 4:
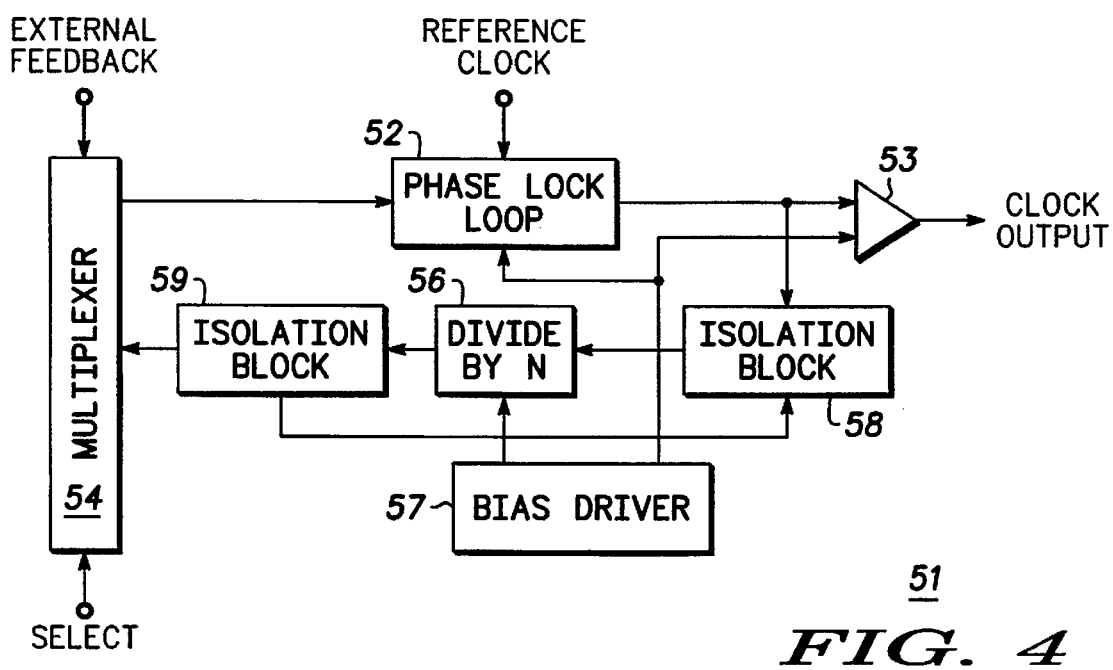
FIG. 4 is an illustration of a phase lock loop circuit having block isolation circuitry for reducing power consumption in accordance with the present invention.

FIG. 4 is an illustration of a phase lock loop circuit 51 having block isolation circuitry for reducing power consumption in accordance with the present invention. Phase lock loop circuit 51 includes two feedback paths, one which is provided externally, the other is an internal feedback path. Phase lock loop circuit 51 includes a reference clock input, an external feedback input, a select input, and an output.

Phase lock loop circuit 51 comprises a Phase Lock Loop (PLL) 52, a buffer 53, a multiplexer 54, a divide by N circuit 56, a bias driver 57, an isolation circuit 58, and an isolation circuit 59. Feedback to PLL 52 is provided through multiplexer 54. A control signal applied to the select input determines whether the external feedback input or divide by N circuit 56 is coupled to PLL 52. Buffer 53 is coupled between an output of PLL 52 and the output. Buffer 53 buffers a signal provided by PLL 52. Bias driver 57 provides a reference voltage for enabling current sources of PLL 52, buffer 53, and divide by N circuit 56. Power dissipation of phase lock loop circuit 51 is reduced by turning off current sources of divide by N circuit 56 when external feedback is applied to PLL 52. An output of divide by N circuit 56 floats to a voltage level that is detected by circuitry in isolation circuit 59. Isolation circuit 59 activates isolation circuit 58 to isolate divide by N circuit 56. Isolation circuits 58 and 59 output a predetermined logic level. Current sources of divide by N circuit 56 are disabled by bias driver 57 thereby reducing power consumption of phase lock loop circuit 51. Bias driver 57 maintains the reference voltage to PLL 52 and buffer 53 such that phase lock loop circuit 51 remains active using external feedback.

By now it should be appreciated that a circuit and method have been provided for isolating blocks of current source based circuitry which reduces power consumption. Power consumption of a circuit is minimized by isolating blocks that are unused and turning off current sources of the unused blocks. Isolation of a block is achieved by coupling inputs and outputs of a block through isolation blocks. In an isolation condition, an isolation block outputs a predetermined logic level to prevent propagation of an erroneous logic state to other blocks still in operation. A bias control logic circuit controls isolation blocks and a multiple output bias driver. The multiple output bias driver turns off current sources of an unused block to minimize power consumption.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A method for reducing power consumption of an integrated circuit comprising current source based circuitry, the method including the steps of:

dividing circuitry of the integrated circuit into functional blocks;

turning off current sources of a functional block to reduce power consumption during periods when said functional block is idle; and isolating signal lines out of said functional block to prevent propagation of erroneous signals from said functional block to remaining functional blocks still in operation in the integrated circuit.

2. The method as recited in claim 1 further including a step of providing a predetermined logic level to said signal lines out of said functional block.

3. The method as recited in claim 2 further including a step of detecting when said outputs of said functional block float after said current sources of said functional block are turned off to indicate signal lines out of said functional block should be isolated.

4. A circuit for reducing power consumption of an integrated circuit, the integrated circuit is divided into functional blocks having current source based circuitry that dissipates power under static conditions, the circuit comprising a plurality of isolation blocks for isolating a functional block that is idle, said plurality of isolation blocks are placed in signal paths out of each functional block, said plurality of isolation blocks prevent an idle functional block from propagating erroneous signals to remaining functional blocks operating in the integrated circuit when current sources of said idle functional block are turned off to reduce power dissipated by the integrated circuit.

5. The circuit as recited in claim 4 wherein isolation blocks placed in signal paths out of said idle functional block output a predetermined logic level to remaining functional blocks operating in the integrated circuit when said idle functional block is isolated.

6. The circuit as recited in claim 5 wherein each isolation block is an AND gate.

7. The circuit as recited in claim 5 further including a multiple output bias driver circuit having an output coupled to each functional block for providing a reference voltage for biasing current sources.

8. The circuit as recited in claim 7 wherein said multiple output bias driver circuit is responsive to a bias control logic circuit for turning off current sources of said idle functional block to reduce power dissipation of the integrated circuit.

9. The circuit as recited in claim 8 wherein said an isolation block in a signal path out of said idle functional block detects a float condition due to said current sources being turned off and is activated for isolating said idle functional block.

10. The circuit as recited in claim 8 wherein said isolation blocks are responsive to said bias control logic circuit for isolating said idle functional block.

11. The circuit as recited in claim 10 wherein an AND gate used as an isolation block receives a logic zero level from said bias control logic circuit to isolate a corresponding signal path and said AND gate outputs a logic zero level corresponding to said predetermined logic level.

12. A method for reducing power consumption of an integrated circuit having current source based circuitry, the integrated circuit being divided into functional blocks, the method comprising steps of:

controlling signal paths out of each functional block to allow an idle functional block to be isolated from remaining functional blocks still in operation; and turning off current sources of said idle functional block to reduce power consumption of the integrated circuit.

13. The method as recited in claim 12 further including a step of providing a predetermined logic level to signal paths out of said idle functional block when isolated, said predetermined logic level prevents propagation of an erroneous signal to remaining functional blocks still in operation.

* * * * *